United States Patent
Li

(10) Patent No.: US 10,667,380 B2
(45) Date of Patent: May 26, 2020

(54) PCB AND SIGNAL TRANSMISSION SYSTEM

(71) Applicant: ZHENGZHOU YUNHAI INFORMATION TECHNOLOGY CO., LTD., Zhengzhou, Henan (CN)

(72) Inventor: Junyang Li, Henan (CN)

(73) Assignee: ZHENGZHOU YUNHAI INFORMATION TECHNOLOGY CO., LTD., Zhengzhou, Henan (CN)

( * ) Notice: Subject to any disclaimer, the term of this patent is extended or adjusted under 35 U.S.C. 154(b) by 0 days.

(21) Appl. No.: 16/096,907

(22) PCT Filed: Sep. 11, 2017

(86) PCT No.: PCT/CN2017/101211
§ 371 (c)(1),
(2) Date: Oct. 26, 2018

(87) PCT Pub. No.: WO2018/129944
PCT Pub. Date: Jul. 19, 2018

(65) Prior Publication Data
US 2019/0124758 A1 Apr. 25, 2019

(30) Foreign Application Priority Data
Jan. 12, 2017 (CN) .......................... 2017 1 0021509

(51) Int. Cl.
*H05K 1/02* (2006.01)
*H01R 12/57* (2011.01)
(Continued)

(52) U.S. Cl.
CPC ........... *H05K 1/0216* (2013.01); *H01R 12/57* (2013.01); *H05K 1/0225* (2013.01);
(Continued)

(58) Field of Classification Search
CPC ...... H05K 1/02; H05K 1/0222; H05K 1/0251; H01L 23/04; H01L 23/552; H01L 23/5383
(Continued)

(56) References Cited

U.S. PATENT DOCUMENTS 6,388,208 B1 * 5/2002 Kiani .................... H05K 1/0222
174/260
6,600,790 B1 * 7/2003 Umemura ........... G06F 13/4072
375/257
(Continued)

FOREIGN PATENT DOCUMENTS

| CN | 101932192 A | 12/2010 |
|---|---|---|
| CN | 102811549 A | 12/2012 |
| CN | 106535472 A | 3/2017 |
| EP | 2874474 A3 | 5/2015 |

OTHER PUBLICATIONS

International Search Report for PCT/CN2017/101211 dated Dec. 14, 2017, ISA/CN.

*Primary Examiner* — Tuan T Dinh
(74) *Attorney, Agent, or Firm* — Yue (Robert) Xu; Apex Attorneys at Law, LLP

(57) ABSTRACT

A PCB and a signal transmission system are provided. The PCB includes a connection module, and at least two signal layers and at least two reference layers spaced apart. The connection module comprises a first connection terminal and a second connection terminal. The first connection terminal is connected to at least one first signal layer and is connectable to an external optical interface. The second connection terminal is connected to at least one second signal layer and is connectable to an external electrical interface. Each reference layers is provided with a through-hole, and for each reference layers, there is an overlapping region between a projection region of an orthogonal projection of the connec-
(Continued)

tion module onto the reference layer and a hole region of the through-hole arranged on the reference layer.

15 Claims, 9 Drawing Sheets

(51) Int. Cl.
    *H05K 1/03*     (2006.01)
    *H05K 1/11*     (2006.01)

(52) U.S. Cl.
    CPC ........... *H05K 1/0295* (2013.01); *H05K 1/036* (2013.01); *H05K 1/115* (2013.01); *H05K 1/0243* (2013.01)

(58) Field of Classification Search
    USPC ................ 361/761, 764, 775–784, 792–795; 174/259–262
    See application file for complete search history.

(56) References Cited

U.S. PATENT DOCUMENTS

| | | | | |
|---|---|---|---|---|
| 6,777,620 | B1* | 8/2004 | Abe | H01L 23/552 |
| | | | | 174/255 |
| 7,045,719 | B1* | 5/2006 | Alexander | H05K 1/0251 |
| | | | | 174/262 |
| 7,336,502 | B1* | 2/2008 | Goergen | H05K 1/0251 |
| | | | | 361/780 |
| 2002/0015293 | A1* | 2/2002 | Akiba | H01L 23/5383 |
| | | | | 361/793 |
| 2003/0179558 | A1* | 9/2003 | Giaretta | G02B 6/4201 |
| | | | | 361/777 |
| 2004/0150970 | A1* | 8/2004 | Lee | H05K 1/0251 |
| | | | | 361/794 |
| 2004/0190835 | A1* | 9/2004 | Burdick | H05K 1/0218 |
| | | | | 385/89 |
| 2010/0321910 | A1 | 12/2010 | Hsu | |
| 2012/0305299 | A1 | 12/2012 | Chen | |

\* cited by examiner

PCB AND SIGNAL TRANSMISSION SYSTEM

The present application is the national phase of International Patent Application No. PCT/CN2017/101211 filed on Sep. 11, 2017, which claims priority to Chinese Patent Application No. 201710021509.8, titled "PCB AND SIGNAL TRANSMISSION SYSTEM", filed on Jan. 12, 2017 with the Chinese Patent Office, both of which are incorporated herein by reference in their entireties.

FIELD

The present disclosure relates to the technical field of integrated circuits, and in particular, to a PCB and a signal transmission system.

BACKGROUND

With development of science and technology, a server has been provided with a lot of functions. Due to a limited area of a PCB (Printed Circuit Board), reserved positions on the PCB for some different interfaces are required to be overlapped one to another, in order to achieve versatility of the server.

By reserving positions for different interfaces on the PCB in an overlapped manner, the PCB may be configured to have a type of interface when required, and changed to have another type of interface when requirement is changed. In this way, less number of types of mainboard are required in one aspect, and developing costs can be greatly reduced in another aspect.

However, it is difficult to design reserved overlapping position for an optical interface and an electrical interface, because generated radiation of EMI (Electro Magnetic Interference) is different due to different operating frequencies of the optical interface and the electrical interface. In a case that EMI radiation in using one interface meets requirements, the EMI radiation in using the other interface cannot meet the requirements. Therefore, the reuse of reserved overlapping position for the optical interface and the electrical interface is hard to be achieved at present.

TECHNICAL ISSUE

A PCB and a signal transmission system are provided according to embodiments of the present disclosure, which can achieve the reuse of the reserved overlapping position for an optical interface and an electrical interface.

SOLUTION TO PROBLEM

Technical Solution

In a first aspect, a PCB is provided according to an embodiment of the present disclosure, where the PCB includes a connection module, at least two signal layers, and at least two reference layers.

The at least two signal layers and the at least two reference layers are spaced apart.

The connection module includes a first connection terminal and a second connection terminal.

The first connection terminal is connected to at least one first signal layer in the at least two signal layers, and is connectable to an external optical interface.

The second connection terminal is connected to at least one second signal layer in the at least two signal layers, and is connectable to an external electrical interface.

Each of the at least two reference layers is provided with a through-hole, and for each of the at least two reference layers, there is an overlapping region between a projection region of an orthogonal projection of the connection module onto the reference layer and a hole region of the through-hole arranged on the reference layer.

Preferably, for each of the at least two reference layers, the overlapping region between the projection region of the orthogonal projection of the connection module onto the reference layer and the hole region of the through-hole arranged on the reference layer meets a condition that the projection region of the orthogonal projection of the connection module onto the reference layer partially overlaps with the hole region of the through-hole arranged on the reference layer.

Preferably, for each of the at least two reference layers, the overlapping region between the projection region of the orthogonal projection of the connection module onto the reference layer and the hole region of the through-hole arranged on the reference layer meets a condition that the projection region of the orthogonal projection of the connection module onto the reference layer exactly overlaps with the hole region of the through-hole arranged on the reference layer.

Preferably, for each of the at least two reference layers, the overlapping region between the projection region of the orthogonal projection of the connection module onto the reference layer and the hole region of the through-hole arranged on the reference layer meets a condition that the hole region of the through-hole arranged on the reference layer covers the projection region of the orthogonal projection of the connection module onto the reference layer.

Preferably, the PCB further includes a power source layer.

The at least one first signal layer and a first reference layer in the at least two reference layers are located at a first side of the power source layer, where the first reference layer corresponds to the at least one first signal layer. The at least one second signal layer and a second reference layer in the at least two reference layers are located at a second side of the power source layer, where the second reference layer corresponds to the at least one second signal layer.

Preferably, the number of the at least one first signal layer is same as the number of the at least one first reference layer, and the at least one first signal layer and the at least one first reference layer are alternately arranged.

The number of the at least one second signal layer is same as the number of the at least one second reference layer, and the at least one second signal layer and the at least one second reference layer are alternately arranged.

At each of the first side and the second side of the power source layer, one of the at least two reference layers is adjacent to the power source layer.

In a second aspect, a signal transmission system is provided according to an embodiment of the present disclosure, including an expansion interface, and the printed circuit board PCB according to any one of claims 1 to 6.

The expansion interface includes an optical interface or an electrical interface.

Preferably, in a case that the expansion interface includes the optical interface, a GND-removed region is provided on an outer shell of the optical interface, where the GND-removed region exactly overlaps with the projection region.

Preferably, in a case that the expansion interface includes the electrical interface, the signal transmission system further includes a network port transformer. The network port transformer is connected to the connection module and the electrical interface.

Preferably, in a case that the expansion interface includes the optical interface, the optical interface is connected to the first connection terminal, and in a case that the expansion interface includes the electrical interface, the electrical interface is connected to the second connection terminal.

Beneficial Effect of Solution

Beneficial Effect

A PCB and a signal transmission system are provided according to embodiments of the present disclosure. The PCB includes the connection module, the at least two signal layers, and the at least two reference layers, where the at least two signal layers and the at least two reference layers are spaced apart. The first connection terminal in the connection module is connected to the at least one first signal layer in the at least two signal layers, and is connectable to the external optical interface. The second connection terminal in the connection module is connected to the at least one second signal layer in the at least two signal layers, and is connectable to the external electrical interface. Each of the reference layers is provided with the through-hole. For each of the reference layers, there is the overlapping region between the projection region of the orthogonal projection of the connection module onto the reference layer and the hole region of the through-hole arranged on the reference layer. A signal is transmitted to the first signal layer via the first connection terminal in a case that the optical interface is used, and a signal is transmitted to the second signal layer via the second connection terminal in a case that the electrical interface is used. Furthermore, the through-hole provided on each of the reference layers can reduce EMI radiation. Therefore, the reuse of the reserved overlapping position for the optical interface and the electrical interface can be achieved.

BRIEF DESCRIPTION OF THE DRAWINGS

Drawing Description

For clearer illustration of the technical solutions according to embodiments of the present disclosure or conventional techniques, hereinafter are briefly described the drawings to be used in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION

Embodiments

To make the object, technical solutions and advantages of the present application clearer, the technical solutions according to the embodiments of the present application will be described clearly and completely as follows in conjunction with the drawings in the embodiments of the present application. It is apparent that the described embodiments are only a part of the embodiments according to the present application, rather than all the embodiments. Any other embodiments obtained by those skilled in the art based on the embodiments in the present application without any creative efforts fall within the protection scope of the present application.

A PCB is provided according to an embodiment of the present disclosure, where the PCB includes a connection module, at least two signal layers, and at least two reference layers.

The at least two signal layers and the at least two reference layers are spaced apart.

The connection module includes a first connection terminal and a second connection terminal.

The first connection terminal is connected to at least one first signal layer in the at least two signal layers, and is connectable to an external optical interface.

The second connection terminal is connected to at least one second signal layer in the at least two signal layers, and is connectable to an external electrical interface.

Each of the reference layers is provided with a through-hole. For each of the reference layers, there is an overlapping region between a projection region of an orthogonal projection of the connection module onto the reference layer and a hole region of the through-hole arranged on the reference layer.

In the above embodiment, the at least two signal layers and the at least two reference layers are spaced apart. The first connection terminal in the connection module is connected to the at least one first signal layer in the at least two signal layers, and is connectable to the external optical interface. The second connection terminal in the connection module is connected to the at least one second signal layer in the at least two signal layers, and is connectable to the external electrical interface. Each of the reference layers is provided with the through-hole, and for each of the reference layers, there is the overlapping region between the projection region of the orthogonal projection of the connection module onto the reference layer and the hole region of the through-hole arranged on the reference layer. A signal is transmitted to the first signal layer via the first connection terminal in a case that the optical interface is used, while a signal is transmitted to the second signal layer via the second connection terminal in a case that the electrical interface is used. Furthermore, the through-hole provided on each of the reference layers can reduce EMI radiation. Therefore, the reuse of reserved overlapping position for the optical interface and the electrical interface can be achieved.

Figure 1:
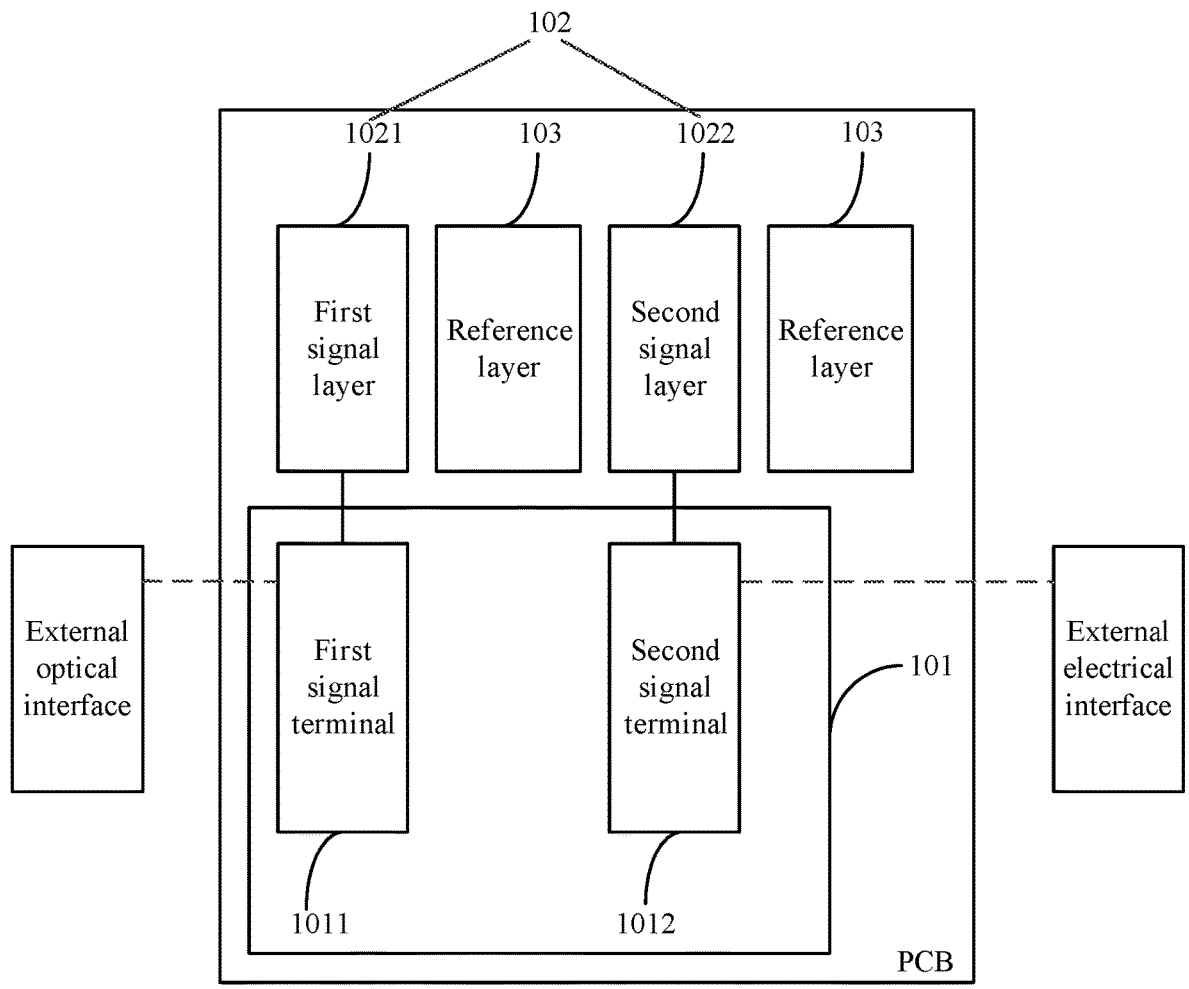
FIG. 1 is a schematic structural diagram of a PCB according to an embodiment of the present disclosure.

As shown in FIG. 1, according to an embodiment of the present disclosure, the PCB includes a connection module 101, two signal layers 102, and two reference layers 103.

The two signal layers 102 and the two reference layers 103 are spaced apart.

The connection module includes a first connection terminal 1011 and a second connection terminal 1012.

The first connection terminal 1011 is connected to a first signal layer 1021 in the two signal layers 102, and is connectable to an external optical interface.

The second connection terminal 1012 is connected to a second signal layer 1022 in the two signal layers 102, and is connectable to an external electrical interface.

Figure 8:
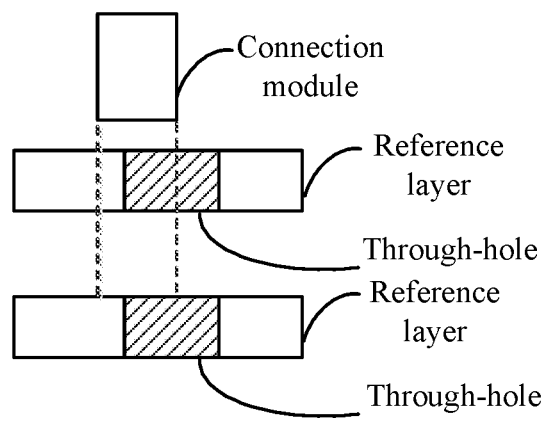
FIG. 8 is a schematic diagram showing that, for each reference layer, there is an overlapping region between a projection region of an orthogonal projection of a connection module onto a reference layer and a hole region of a through-hole arranged on the reference layer according to an embodiment of the present disclosure.

Each of the reference layers 103 is provided with a through-hole. For each of the reference layers, there is an overlapping region between a projection region of an orthogonal projection of the connection module onto the reference layer and a hole region of the through-hole arranged on the reference layer, as shown in FIG. 8.

In this embodiment, the hole region of the through-hole on the reference layer is formed by a GND splitting process. The GND splitting process performed on the reference layer can well address an issue of signal crossing and signal loop, thereby reducing loop EMI radiation.

It should be noted that the number of the first signal layer and the number of the second signal layer can be determined by a user according to requirements. For example, the number of the first signal layer and the number of the second signal layer may be 2, 3, 6. The number of the first signal layer may be same as or different from the number of the second signal layer. For example, there may be 3 first signal layers and 4 second signal layers. For another example, there may be 6 first signal layers and 3 second signal layers. The user may determine the numbers of the layers according to requirements. Since the connection module is used to mount the optical interface or the electrical interface, the projection region of the orthogonal projection of the connection module onto each reference layer is equivalent to the projection region of the orthogonal projection of the optical interface or the electrical interface onto each reference layer. The connection module may not be a physical module, but an installation region reserved for the optical interface or the electrical interface, in which a connection terminal is provided to connect with the optical interface or the electrical interface. The connection terminal may be a pin, a copper bar, and the like.

In order to reduce the EMI radiation of the optical interface or the electrical interface, according to an embodiment of the present disclosure, for each of the reference layers, the overlapping region between the projection region of the orthogonal projection of the connection module onto the reference layer and the hole region of the through-hole arranged on the reference layer meets a condition that the projection region of the orthogonal projection of the connection module onto the reference layer partially overlaps with the hole region of the through-hole arranged on the reference layer.

Figure 2:
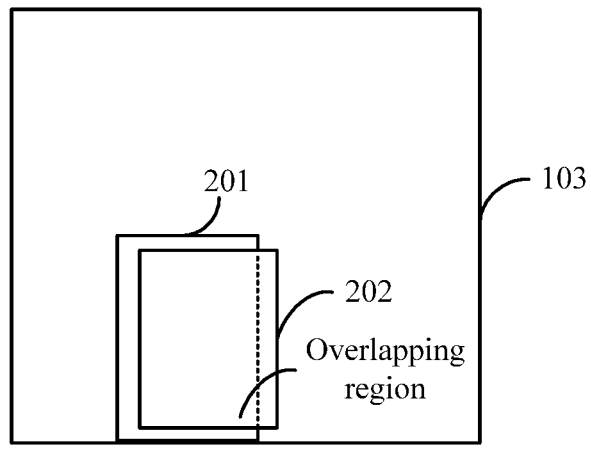
FIG. 2 is a schematic diagram showing an overlapping region between a projection region of a connection module and a hole region of a through-hole according to an embodiment of the present disclosure.

In the embodiment, the reference layer is a GND layer. The through-hole on the reference layer is formed by splitting the reference layer. In order to minimize the EMI radiation of the optical interface or the electrical interface, the through-hole may be provided on each of the reference layers. In order to effectively reduce the EMI radiation of the optical interface or the electrical interface, the through-hole on the reference layer should not deviate too much from the projection region of the orthogonal projection of the connection module onto each reference layer, otherwise the EMI radiation of the optical interface or the electrical interface cannot be reduced by means of the through-hole. One of the reference layers is taken as an example to illustrate that the projection region of the orthogonal projection of the connection module onto the reference layer partially overlaps with the hole region of the through-hole arranged on the reference layer, referring to FIG. 2. In FIG. 2, 103 represents the reference layer, 201 represents the projection region of the orthogonal projection of the connection module onto the reference layer, and 202 represents the hole region of the through-hole. The size of the overlapping region shown in the figure is only for illustration, which may be different in practice. Generally, an area of the overlapping region is required to be more than 85% of each of an area of the projection region of the orthogonal projection of the connection module onto the reference layer and an area of the hole region of the through-hole. For different PCBs and different devices on the PCB, the percentage of the area of the overlapping region may be different.

In order to further reduce the EMI radiation of the optical interface or the electrical interface, according to an embodiment of the present disclosure, for each of the reference layers, the overlapping region between the projection region of the orthogonal projection of the connection module onto the reference layer and the hole region of the through-hole arranged on the reference layer meets a condition that the projection region of the orthogonal projection of the connection module onto the reference layer exactly overlaps with the hole region of the through-hole arranged on the reference layers.

Figure 3:
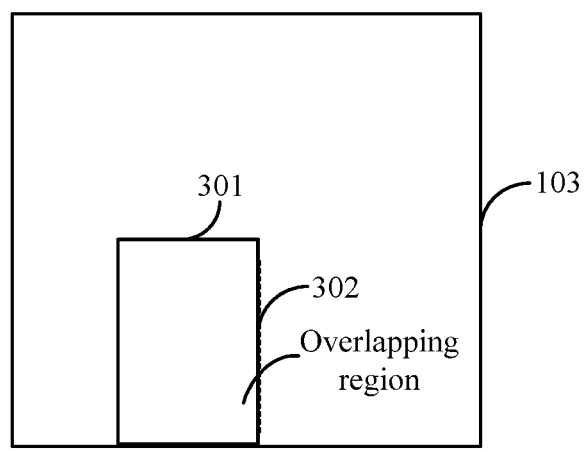
FIG. 3 is a schematic diagram of another overlapping region between a projection region of a connection module and a hole region of a through-hole according to an embodiment of the present disclosure.

In the embodiment, the hole region of the through-hole on each reference layer exactly overlaps with the projection region of the orthogonal projection of the connection module onto the reference layer, that is, the hole region of the through-hole has a same shape and a same size as the projection region of the orthogonal projection of the connection module onto the reference layer. Since the connection module is used to mount an optical interface or an electrical interface, the hole region of the through-hole has a same shape and a same size as the optical interface or the electrical interface. One of the reference layers is taken as an example to illustrate that the projection region of the orthogonal projection of the connection module onto the reference layer exactly overlaps with the hole region of the through-hole arranged on the reference layer, referring to FIG. 3. In the figure, 103 represents the reference layer, 301 represents the projection region of the orthogonal projection of the connection module onto the reference layer, and 302 represents the hole region of the through-hole.

In order to improve universality of the PCB, according to an embodiment of the present disclosure, for each of the reference layers, the overlapping region between the projection region of the orthogonal projection of the connection module onto the reference layer and the hole region of the through-hole arranged on the reference layer meets a condition that the hole region of the through-hole arranged on the reference layer covers the projection region of the orthogonal projection of the connection module onto the reference layer.

Figure 4:
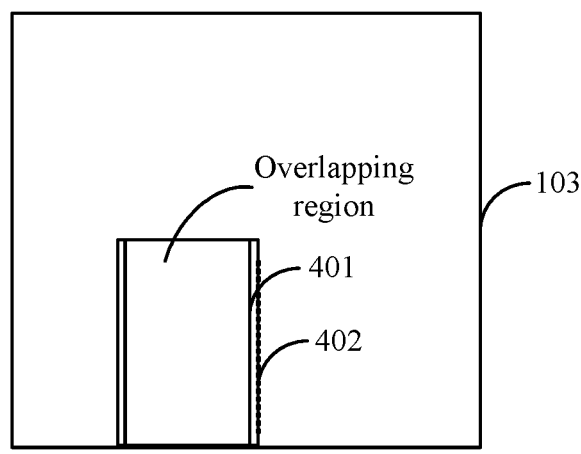
FIG. 4 is a schematic diagram of yet another overlapping region between a projection region of a connection module and a hole region of a through-hole according to an embodiment of the present disclosure.

In the embodiment, since a size of the optical interface is larger than a size of the electrical interface, a size of the hole region is required to be considered for forming the hole region of the through-hole in fabricating the PCB. One of the reference layers is taken as an example to illustrate that the projection region of the orthogonal projection of the connection module onto the reference layer covers the hole region of the through-hole, referring to FIG. 4. In FIG. 4, 103 represents the reference layer, 401 represents the projection region of the orthogonal projection of the connection module onto the reference layer, and 402 represents the hole region of the through-hole. It should be noted that the hole region cannot be too large. Otherwise, it is meaningless to set the through-hole, because EMI radiation cannot be reduced in that case, and furthermore a utilization area of the reference layer is reduced. Generally, the area of the hole region of the through-hole is more than 80% of the area of the projection region of the orthogonal projection of the connection module onto the reference layer. For different PCBs and different devices on the PCB, the percentage of the area of the overlapping region may be different.

According to an embodiment of the present disclosure, the PCB may further include a power source layer. The at least one first signal layer and a first reference layer in the at least two reference layers are located at a first side of the power source layer, where the first reference layer corresponds to the first signal layer. The at least one second signal layer and a second reference layer in the at least two reference layers are located at a second side of the power source layer, where the second reference layer corresponds to the second signal layer.

In the embodiment, the first signal layer and the first reference layer corresponding to the optical interface are separated from the second signal layer and the second reference layer corresponding to the electrical interface, by being arranged on two sides of the power source layer respectively, to prevent mutual influences. The influence of a power source on a signal can be reduced by arranging the power source layer. Furthermore, the power source layer is adjacent to the reference layer, and thereby impedance of the power source layer and the reference layer can be reduced, and a resonance frequency can be increased, so as to have a better performance of a power system in the PCB.

Figure 5:
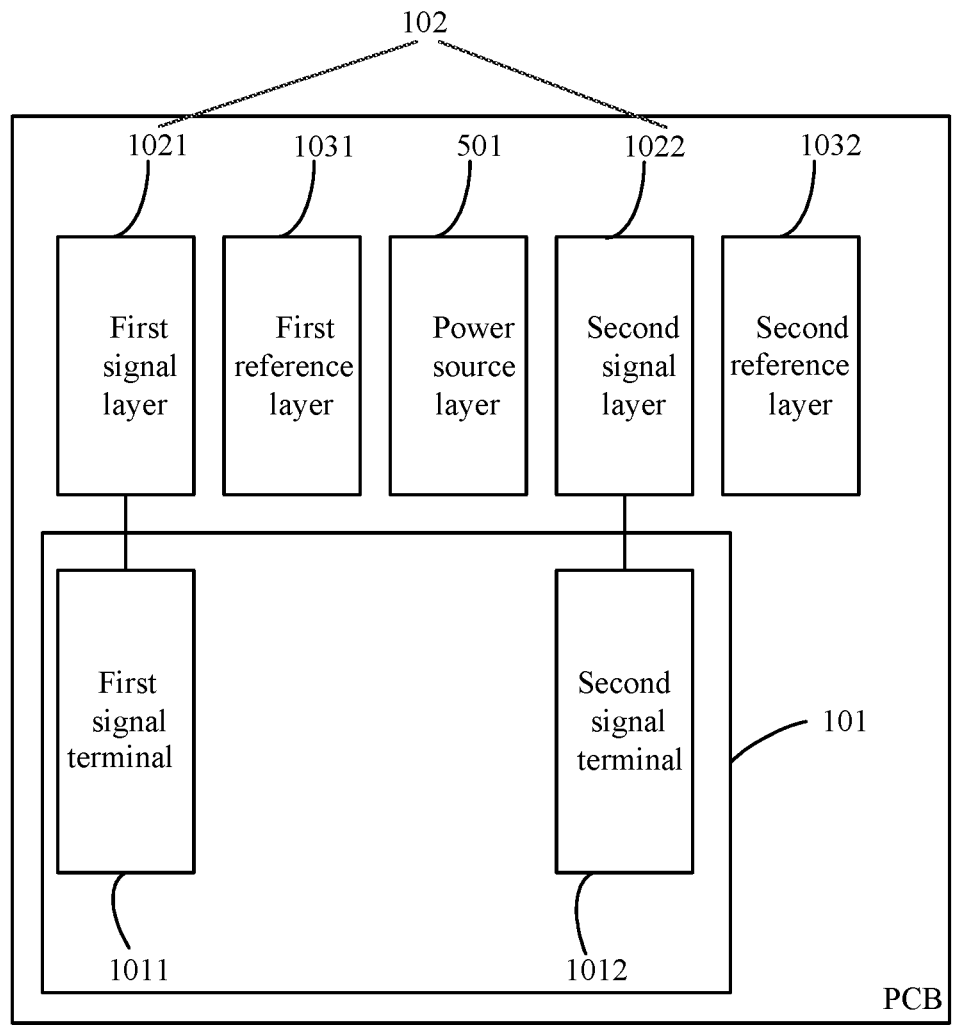
FIG. 5 is a schematic structural diagram of another PCB according to an embodiment of the present disclosure.

As shown in FIG. 5, according to an embodiment of the present disclosure, the PCB includes the power source layer 501. The first signal layer 1021 and the first reference layer 1031 in the two reference layers 103 are located at the first side of the power source layer 501. The second signal layer 1022 and the second reference layer 1032 in the two reference layers 103 are located at the second side of the power source layer 501.

It should be noted that a power supply group may be formed by multiple adjacent power source layers.

According to an embodiment of the present disclosure, the number of the first signal layer is same as the number of the first reference layer, and the first signal layer and the first reference layer are alternately arranged.

The number of the second signal layer is same as the number of the second reference layer, and the second signal layer and the second reference layer are alternately arranged.

At each of the first side and the second side of the power source layer, one of the reference layers is adjacent to the power source layer.

In the embodiment, the first signal layer and the first reference layer are alternately arranged, and the second signal layer and the second reference layer are alternately arranged. The alternate arrangement of the signal layer and the reference layer can avoid adjacency among the signal layers, thereby improving isolation between signals, and effectively avoiding crosstalk. Since the number of reference layers and the number of signal layers are same and the power source layer group is adjacent to reference layers, two outermost layers of the PCB are a first signal layer and a second signal layer respectively.

Figure 6:
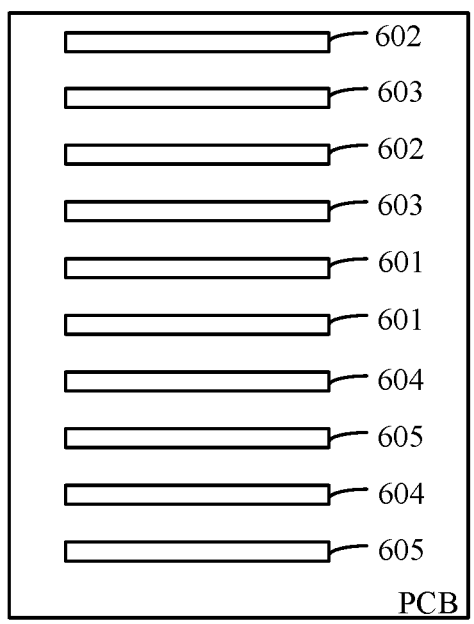
FIG. 6 is a schematic structural diagram of a PCB including 10 layers of boards according to an embodiment of the present disclosure.

In order to clearly explain the position relationship of the layers, a 10-layer PCB is taken as an example to illustrate an arrangement of the first signal layer, the first reference layer, the second signal layer, the second reference layer, and the power source layer, referring to FIG. 6. In FIG. 6, a first layer, a second layer, . . . , and a tenth layer are sequentially arranged from top to bottom. The fifth layer and sixth layer are the power source layers 601, forming a power source layer group. The first layer to the fourth layer are the first signal layers 602 and the first reference layers 603 which are alternately arranged above the PCB power group. The seventh layer to tenth layer are the second reference layers 604 and the second signal layers 605 which are alternately arranged below the PCB power group.

It should be noted that, the embodiment shown in FIG. 6 is only a specific case, and there may be other cases in practices. For example, the PCB may include 8 layers, 16 layers, and the like. Besides that the first signal layer and the first reference layer are located above the power source layer and the second signal layer and the second reference layer are located below the power source layer, the second signal layer and the second reference layer may be located above the power source layer, and the first signal layer and the first reference layer may be located below the power source layer.

Figure 7:
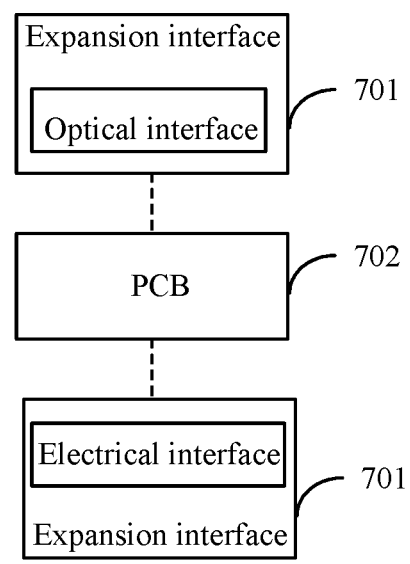
FIG. 7 is a schematic structural diagram of a signal transmission system according to an embodiment of the present disclosure.

As shown in FIG. 7, a signal transmission system is provided according to an embodiment of the present disclosure, where the signal transmission system may include an expansion interface 701, and a PCB 702 according to any embodiment of the present disclosure.

The expansion interface includes an optical interface or an electrical interface.

In the embodiment, the expansion interface may be determined according to actual situations, so as to achieve the reuse of the reserved overlapping position. Different expansion interfaces may be mounted in different situations.

Figure 10:
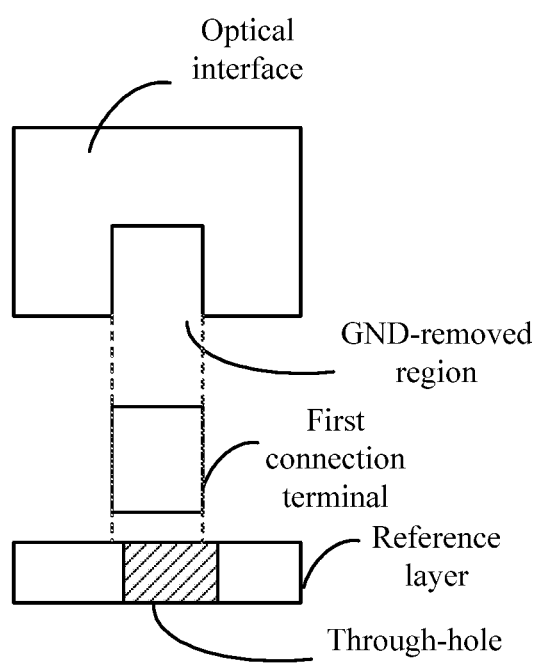
FIG. 10 is a schematic diagram showing a GND-removed region is provided on an outer shell of an optical interface and the GND-removed region exactly overlaps with a projection region of a connection module according to an embodiment of the present disclosure.

In order to further reduce the EMI radiation of the optical interface, according to an embodiment of the present disclosure, in a case that the expansion interface includes the optical interface, a GND-removed region is provided on an outer shell of the optical interface, where the GND-removed region exactly overlaps with the projection region, as shown in FIG. 10.

In the embodiment, the GND-removed region is provided on the outer shell of the optical interface. That is, GND of the outer shell of the optical interface is subjected to a splitting process, thereby forming the GND-removed region. The GND-removed region exactly overlaps with the projection region. A contact area between the optical interface and the PCB is equal to an area of the connection module. That is, the GND-removed region has a same area as the contact area between the optical interface and the PCB.

Figure 9:
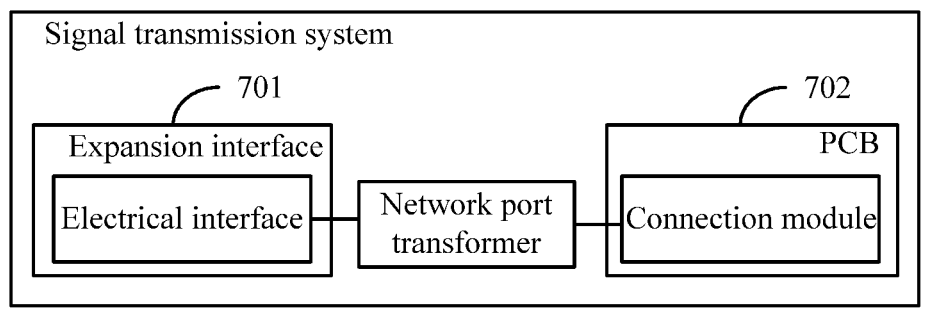
FIG. 9 is a schematic structure diagram of a signal transmission system according to an embodiment of the present disclosure.

In order to further reduce the EMI radiation of the optical interface, according to an embodiment of the present disclosure, the signal transmission system further includes a network port transformer (not shown) in a case that the expansion interface includes the electrical interface, as shown in FIG. 9. The network port transformer is connected to the connection module and the electrical interface.

In the embodiment, the transformer of the electrical interface is made as an independent network port transformer, instead of integrating into the electrical interface. In one aspect, signals can be enhanced to have a longer transmitting distance, and the PCB is isolated from outside to greatly enhance an anti-interference ability. This can protect the PCB to some extent because the PCB is not influenced by different levels of connected electrical interfaces. In another aspect, which is more important, a common mode current can be suppressed, which further reduces the EMI radiation of the electrical interface since magnitude of EMI radiation noise is mainly determined by the common mode current.

It should be noted that the electrical interface and the optical interface may be isolated, so that a noise of the network is not apt to radiate via a network cable and a cable, thereby further reducing the EMI radiation of the optical interface and the electrical interface.

According to an embodiment of the present disclosure, in a case that the expansion interface includes the optical interface, the optical interface is connected to the first connection terminal, and in a case that the expansion interface includes the electrical interface, the electrical interface is connected to the second connection terminal.

In summary, the embodiments of the present disclosure have at least the following beneficial effects.

1. According to an embodiment of the present disclosure, the at least two signal layers and the at least two reference layers are spaced apart. The first connection terminal in the connection module is connected to the at least one first signal layer in the at least two signal layers, and is connectable to the external optical interface. The second connection terminal in the connection module is connected to the at least one second signal layer in the at least two signal layers, and is connectable to the external electrical interface. Each of the reference layers is provided with the through-hole. For each of the reference layers, there is the overlapping region between the projection region of the orthogonal projection of the connection module onto the reference layer and the hole region of the through-hole arranged on the reference layer. A signal is transmitted to the first signal layer via the first connection terminal in a case that the optical interface is used, and a signal is transmitted to the second signal layer via the second connection terminal in a case that the electrical interface is used. Furthermore, the through-hole provided on each of reference layers can reduce EMI radiation. Therefore, the reuse of the reserved overlapping position for the optical interface and the electrical interface can be achieved.

2. According to an embodiment of the present disclosure, a relatively stable reference level and a low inductance signal loop is provided by arranging at least one first reference layer and at least one second reference layer. Thereby, all signal lines have a determined impedance and crosstalk between signals can be controlled, effectively reducing impedance of the PCB and the EMI radiation. The first reference layer and the second reference layer correspond to the optical interface and the electrical interface, respectively, so that EMC demands can be met no matter which of the optical interface and the electrical interface is used.

3. According to an embodiment of the present disclosure, a first GND layer is split by arranging the through-hole, which can well address the issue of signal crossing and signal loop, thereby reducing the loop EMI radiation.

4. According to an embodiment of the present disclosure, the power source layer is arranged and the power source layer is adjacent to the first reference layer and the second reference layer. In this way, impedance of a power plane can be reduced, thereby improving the performance of the power system.

5. According to an embodiment of the present disclosure, the first signal layer and the first reference layer are alternately arranged, and the second signal layer and the second reference layer are alternately arranged. The alternate arrangement can avoid adjacency among the signal layers, thereby improving the isolation between signals, and effectively avoiding crosstalk.

6. According to an embodiment of the present disclosure, the network port transformer is independent from the electrical interface. In one aspect, signals can be enhanced to have the longer transmission distance, and the PCB is isolated from the outside to have the greater anti-interference ability. This can protect the PCB to some extent because the PCB is not influenced by different levels of connected electrical interfaces. In another aspect, the common mode current can be suppressed, which further reduces the EMI radiation of the electrical interface.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other similar elements may exist in the process, the method, the article or the device other than enumerated elements.

Those skilled in the art can appreciate that all or part of the steps to implement the above method embodiments may be implemented by using relevant hardware instructed by a program. The aforementioned program may be stored in a computer readable storage medium, and the program when executed performs the steps including the aforementioned embodiments. The aforementioned storage medium includes various media which can store a program code, such as a ROM, a RAM, a magnetic disk, or an optic disk.

It should be noted that, only preferable embodiments of the present disclosure are described above, and are intended to illustrate the technical solutions of the present disclosure, instead of limiting the protection scope of the present disclosure. Any modification, equivalent replacement, improvement, and the like made within the spirit and principle of the present disclosure falls within the protection scope of the present disclosure.

The invention claimed is:

1. A printed circuit board (PCB), comprising:
    a connection module,
    at least two signal layers, and at least two reference layers, wherein:
the at least two signal layers and the at least two reference layers are spaced apart;
the connection module comprises a first connection terminal and a second connection terminal;
the first connection terminal is connected to at least one first signal layer in the at least two signal layers, and is connectable to an external optical interface;
the second connection terminal is connected to at least one second signal layer in the at least two signal layers, and is connectable to an external electrical interface; and
each of the at least two reference layers is provided with a through-hole, and for each of the at least two reference layers, there is an overlapping region between a projection region of an orthogonal projection of the connection module onto the reference layer and a hole region of the through-hole arranged on the reference layer.

2. The PCB according to claim 1, wherein for each of the at least two reference layers, the overlapping region between the projection region of the orthogonal projection of the connection module onto the reference layer and the hole region of the through-hole arranged on the reference layer meets a condition that:
the projection region of the orthogonal projection of the connection module onto the reference layer partially overlaps with the hole region of the through-hole arranged on the reference layer.

3. The PCB according to claim 1, wherein for each of the at least two reference layers, the overlapping region between the projection region of the orthogonal projection of the connection module onto the reference layer and the hole region of the through-hole arranged on the reference layer meets a condition that:
the hole region of the through-hole arranged on the reference layer covers the projection region of the orthogonal projection of the connection module onto the reference layer.

4. The PCB according to claim 1, wherein for each of the at least two reference layers, the overlapping region between the projection region of the orthogonal projection of the connection module onto the reference layer and the hole region of the through-hole arranged on the reference layer meets a condition that:
the projection region of the orthogonal projection of the connection module onto the reference layer exactly overlaps with the hole region of the through-hole arranged on the reference layer.

5. The PCB according to claim 1, further comprising a power source layer, wherein:
the at least one first signal layer and a first reference layer in the at least two reference layers are located at a first side of the power source layer, wherein the first reference layer corresponds to the at least one first signal layer; and
the at least one second signal layer and a second reference layer in the at least two reference layers are located at a second side of the power source layer, wherein the second reference layer corresponds to the at least one second signal layer.

6. The PCB according to claim 5, wherein:
the number of the at least one first signal layer is same as the number of the at least one first reference layer, and the at least one first signal layer and the at least one first reference layer are alternately arranged;
the number of the at least one second signal layer is same as the number of the at least one second reference layer, and the at least one second signal layer and the at least one second reference layer are alternately arranged; and
at each of the first side and the second side of the power source layer, one of the at least two reference layers is adjacent to the power source layer.

7. A signal transmission system, comprising:
an expansion interface, and
a printed circuit board PCB, wherein:
the expansion interface comprises one of an optical interface and an electrical interface;
the PCB comprises a connection module, at least two signal layers, and at least two reference layers;
the at least two signal layers and the at least two reference layers are spaced apart;
the connection module comprises a first connection terminal and a second connection terminal;
the first connection terminal is connected to at least one first signal layer in the at least two signal layers, and the first connection terminal is connectable to the optical interface in a case that the expansion interface comprises the optical interface;
the second connection terminal is connected to at least one second signal layer in the at least two signal layers, and the second connection terminal is connectable to the electrical interface in a case that the expansion interface comprises the electrical interface; and
each of the at least two reference layers is provided with a through-hole, and for each of the at least two reference layers, there is an overlapping region between a projection region of an orthogonal projection of the connection module onto the reference layer and a hole region of the through-hole arranged on the reference layer.

8. The signal transmission system according to claim 7, wherein:
in a case that the expansion interface comprises the optical interface,
a GND-removed region is provided on an outer shell of the optical interface, and the GND-removed region exactly overlaps with the projection region.

9. The signal transmission system according to claim 7, wherein:
in a case that the expansion interface comprises the electrical interface,
the signal transmission system further comprises a network port transformer, and the network port transformer is connected to the connection module and the electrical interface.

10. The signal transmission system according to claim 7, wherein:
in a case that the expansion interface comprises the optical interface, the optical interface is connected to the first connection terminal; and
in a case that the expansion interface comprises the electrical interface, the electrical interface is connected to the second connection terminal.

11. The signal transmission system according to claim 7, wherein for each of the at least two reference layers, the overlapping region between the projection region of the orthogonal projection of the connection module onto the reference layer and the hole region of the through-hole arranged on the reference layer meets a condition that:

the projection region of the orthogonal projection of the connection module onto the reference layer partially overlaps with the hole region of the through-hole arranged on the reference layer.

12. The signal transmission system according to claim 7, wherein for each of the at least two reference layers, the overlapping region between the projection region of the orthogonal projection of the connection module onto the reference layer and the hole region of the through-hole arranged on the reference layer meets a condition that:

the hole region of the through-hole arranged on the reference layer covers the projection region of the orthogonal projection of the connection module onto the reference layer.

13. The signal transmission system according to claim 7, wherein for each of the at least two reference layers, the overlapping region between the projection region of the orthogonal projection of the connection module onto the reference layer and the hole region of the through-hole arranged on the reference layer meets a condition that:

the projection region of the orthogonal projection of the connection module onto the reference layer exactly overlaps with the hole region of the through-hole arranged on the reference layer.

14. The signal transmission system according to claim 7, wherein the PCB further comprises a power source layer;

the at least one first signal layer and a first reference layer in the at least two reference layers are located at a first side of the power source layer, wherein the first reference layer corresponds to the at least one first signal layer; and the at least one second signal layer and a second reference layer in the at least two reference layers are located at a second side of the power source layer, wherein the second reference layer corresponds to the at least one second signal layer.

15. The signal transmission system according to claim 14, wherein:

the number of the at least one first signal layer is same as the number of the at least one first reference layer, and the at least one first signal layer and the at least one first reference layer are alternately arranged;

the number of the at least one second signal layer is same as the number of the at least one second reference layer, and the at least one second signal layer and the at least one second reference layer are alternately arranged; and at each of the first side and the second side of the power source layer, one of the at least two reference layers is adjacent to the power source layer.

* * * * *